United States Patent [19]

Graul et al.

[11] 4,107,719
[45] Aug. 15, 1978

[54] INVERSE PLANAR TRANSISTOR

[75] Inventors: Jüergen Graul, Gruenwald; Helmut Murrmann, Ottobrunn, both of Germany

[73] Assignee: Siemens Aktiengesellschaft, Berlin & Munich, Germany

[21] Appl. No.: 749,438

[22] Filed: Dec. 10, 1976

Related U.S. Application Data

[63] Continuation-in-part of Ser. No. 656,940, Feb. 10, 1976, abandoned.

[30] Foreign Application Priority Data

Feb. 19, 1975 [DE] Fed. Rep. of Germany ....... 2507148

[51] Int. Cl.² .............................................. H01L 29/48
[52] U.S. Cl. ........................................ 357/15; 357/35; 357/44; 357/46; 357/92
[58] Field of Search ..................... 357/35, 15, 44, 46, 357/92

[56] References Cited

U.S. PATENT DOCUMENTS 3,995,301  11/1976  Magdo ................................. 357/15

FOREIGN PATENT DOCUMENTS 805,341    1/1969  Canada ................................. 357/15
2,224,574  11/1972 Fed. Rep. of Germany ............. 357/44
1,398,862  6/1975  United Kingdom ..................... 357/44

OTHER PUBLICATIONS

R. N. Noyce et al., "Schottky Diodes Make IC Scene," *Electronics*, Jul. 21, 1969, pp. 74–80.
Hodges, "Low-Power Bipolar Transistor Memory Cells," *IEEE Journal of Solid-State Circuits*, vol. SC-4, No. 5, Oct. 1969.
Anantha et al., "Planar Mesa Schottky Barrier Diode," *IBM J. Res. Develop*, Nov. 1971, pp. 442–445.

*Primary Examiner*—Stanley D. Miller, Jr.
*Assistant Examiner*—James W. Davie
*Attorney, Agent, or Firm*—Hill, Gross, Simpson, Van Santen, Steadman, Chiara & Simpson

[57] ABSTRACT

This invention relates to an inverse planar transistor in which a base region of one conductivity type is formed in a semiconductor body of the opposite conductivity type adjacent a planar surface thereof. The collector of the transistor is provided by a Schottky contact on a portion of the outer face of the base region. A highly doped protective ring of the opposite conductivity type to that of the base region is provided for the Schottky contact. An enlarged thickness of the passivation layer adjacent the opening therethrough to provide an effective guard ring. A relatively highly doped buried layer of said opposite conductivity type is located in the semiconductor body below and spaced from the inner surface of the base region. The portion of the semiconductor body lying between the base region and the buried layer together with the buried layer form the emitter of the transistor. A highly doped region of the said opposite conductivity type extends from the planar surface to the buried layer. A layer of insulating material covers the planar surface except where contacts extend therethrough. A guard ring of the first impurity type extends around the transistor. The doping concentration across the base region from the planar surface is at first approximately $5 \times 10^{16}$ cm$^{-3}$ and then rises to approximately $5 \times 10^{17}$ cm$^{-3}$, which is reached at a distance of approximately 0.2 microns from the surface. It then falls off until the base-emitter junction is reached. The emitter zone portion interfaced with the base region has a doping concentration of less than $10^{16}$ cm$^{-3}$. At a depth of 1.0 microns from the planar surface it greatly increases because of the highly doped buried layer.

3 Claims, 4 Drawing Figures

INVERSE PLANAR TRANSISTOR

CROSS REFERENCE TO RELATED APPLICATION

This application is a continuation-in-part of our copending application, Ser. No. 656,940, filed Feb. 10, 1976 now abandoned, and assigned to the same assignee as the present invention.

BACKGROUND OF THE INVENTION

1. Field of the Invention

This invention relates to inverse planar transistors.

2. Description of the Prior Art

Integrated circuits in which transistors are operated inversely have already been discussed. In an inversely operated transistor, in contrast to a transistor constructed in the conventional planar technique, the emitter zone is not located on the surface of the semiconductor body or in an epitaxial layer deposited onto a semiconductor substrate, but is arranged in the semiconductor body itself, i.e., beneath the epitaxially deposited layer or in it.

These integrated circuits are referred to as MTL or I²L circuits (merged-transistor-logic or integrated-injection logic).

In an inversely operated transistor, the emitter zone generally consists of a highly doped, so-called "buried layer," which is diffused or implanted into the semiconductor substrate prior to the application of the epitaxially deposited layer; here the part of the epitaxially deposited layer which adjoins the base zone must also be considered as part of the emitter zone.

Usually the collector zone of an inversely operated transistor is produced by the diffusion of a specific doping material, for example, phosphorus or arsenic for npn-transistors. In the planar technique, this diffusion represents the last high-temperature step and is particularly critical since generally this last diffusion step cannot be prevented from influencing the doping conditions in the base zone of the transistor. In the event that a base zone is doped with boron, this influence can, for example, lead to a so-called "dip-effect," which in turn leads to an expansion of the base zone beneath the collector zone when phosphorus is provided as doping material for the collector zone. When the base zone is doped with boron while arsenic is used for the diffusion into the collector zone, a so-called "retardation" or indentation can occur in the base zone beneath the collector zone.

As the base width, i.e., the distance or the difference in thickness between the base penetration depth and the collector penetration depth has a decisive influence on the electric parameters, such as, for example, the cut-off frequency of a transistor, generally it is undesirable that the doping conditions in the base zone should be influenced during the production of the collector zone.

BRIEF SUMMARY OF THE INVENTION

It is an object of the invention to provide an inversely operated planar transistor in which no high-temperature step is necessary after the production of the base zone.

This object is realized in accordance with the invention in that a Schottky contact which acts as collector is provided on the surface of the base zone.

Thus, in the invention, the diffusion of the collector zone is replaced by a metal electrode in the form of a Schottky contact. This is possible both in the case of p-doped base zones (Schottky-pn-transistors) and in the case of n-doped base zones (Schottky-np-transistors). As no high-temperature step is required for the application of the Schottky contact, the inversely operated planar transistors in accordance with the invention exhibit an accurately set base width.

A further development of the invention consists in providing the Schottky contact with a protective ring.

A protective ring may be in the form of a diffusion-, implantation-, or oxidation zone around the Schottky contact, which serves to reduce the edge leakage currents across the Schottky contact. It may also be formed by enlarging the thickness of the passivation layer around the opening through which the Schottky contact extends.

Another further development of the invention consists in the doping concentration of the base zone in the region of the Schottky contact at $\leq 10^{17}/cm^3$.

This doping concentration ensures that the Schottky contact has adequate rectifying properties.

The selection of the metal for the Schottky contact must, depending on the type of doping provided for the base zone, be matched to the barrier height between the metal and the semiconductor material. Thus, for example, a suitable material for the Schottky contact is Pd, Pt, or Al in the case of an n-doped base zone, and Ti or Al in the case of a p-doped base zone.

BRIEF DESCRIPTION OF THE DRAWINGS

In the following, the invention will be explained in detail making reference to the drawings, in which.

DESCRIPTION OF THE PREFERRED EMBODIMENTS

Figure 1:
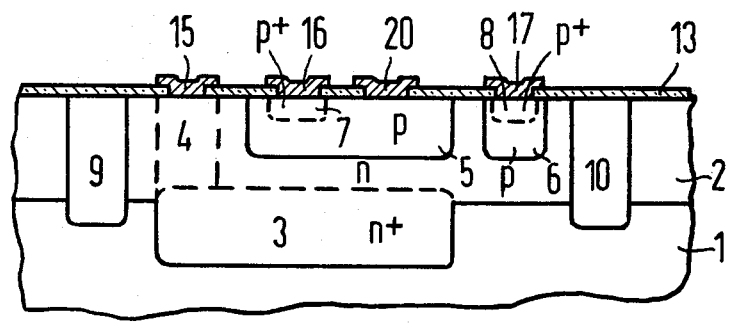
FIG. 1 shows a section through an inverse planar transistor in accordance with the invention.

In FIG. 1, an n-doped, epitaxially deposited semiconductor layer 2 is arranged on a p-doped semiconductor substrate 1. Prior to the application of the semiconductor layer 2, a highly n-doped zone 3 (a buried layer) is produced in the surface of the semiconductor substrate 1.

Arranged in the semiconductor layer 2 are a highly n-doped zone 4, a p-doped zone 5, a p-doped zone 6, a highly p-doped zone 7, a highly p-doped zone 8, and a p-doped circular zone 9.

The zone 4 serves as an electrical connecting conductive path for the zone 3. The zone 5 represents the base zone, whose contact-connecting-zone is the zone 7. The zone 6 which serves as an injector, injects defect electrons (holes) which act as control current for the base zone, and for improved contacting, is provided with a highly doped zone 8. The zone 9 finally is an insulating ring around the entire component.

The emitter is formed by the zone 3 and the zone 14 of the semiconductor layer 2 between the base zone 5 and the buried layer 3.

The surface of the semiconductor layer 2 is covered by an insulating layer, for example, a silicon dioxide layer 13 in which windows are provided through which the contacts 15, 16 and 17 contact the zones 4, 7 and 8, respectively. The contact 15 thus represents the emitter contact, the contact 16 the base contact, and the contact 17 the injector contact.

In accordance with the invention, the collector is in the form of a Schottky contact 20 which can be formed, for example, of titanium or aluminum, since the base zone 5 is p-doped. On its surface the zone 5 has a low doping concentration which is less than $10^{17}$ cm$^{-3}$ so that an adequate blocking effect on the part of the Schottky contact 20 is assured. On account of the good reproducibility of the electric parameters and the possibility of accurately setting the doping profile, expediently, ion implantation is used for the production of the zone 5.

The metal contacts 15, 16 and 17 and the Schottky contact 20 can consist of a titanium-aluminum double layer. An initially applied titanium layer having a thickness of approximately 3,000 A produces ohmic contacts on the connecting zone 4, and the zones 7 and 8, thus for the emitter zone, base zone and the injector, whereas the Schottky contact 20 is formed on the zone 5 on account of the latter's low surface concentration.

Figure 3:
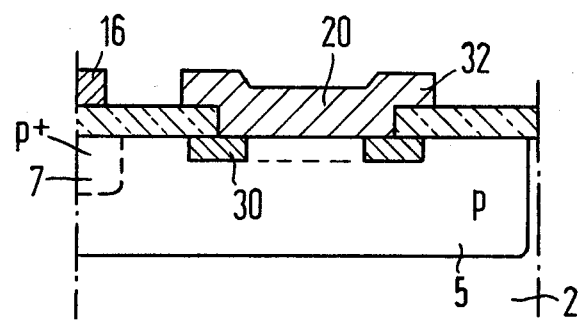
FIG. 3 is an enlarged fragmentary sectional view of an inverse planar transistor in accordance with the invention, with a Schottky contact forming the collector and with a guard ring located in the manner shown.

A particular feature of the present invention is the provision of a guard ring around the area where the Schottky contact forms a junction with the semiconductor layer 2. One form is illustrated in FIG. 3. An annular region 30 is formed by diffusion, ion implantation or otherwise in the upper surface of layer 2 immediately below the edge of the opening where the Schottky contact extends through the insulating layer. A flange portion 32 overlies a portion of the insulating layer adjacent the opening through which the Schottky contact extends. The guard ring 30 is a highly doped region of the opposite impurity type to that of the base region 5.

Figure 4:
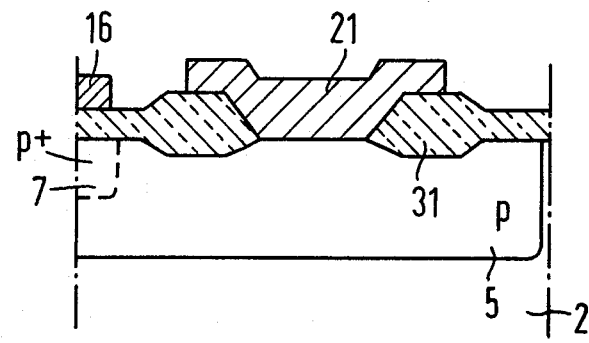
FIG. 4 is an enlarged fragmentary sectional view of a Schottky type collector having a guard ring provided by a thickened portion of an oxide passivation layer surrounding the Schottky contact.

A second form of the invention is shown in FIG. 4. There a guard ring 31 is provided by enlarging the thickness of the insulating layer 13 adjacent the opening through which the Schottky contact 21 extends. As a consequence of the thickened region 31, it manifests a somewhat different geometric shape.

With either a guard ring 30 as shown in FIG. 3 or a guard ring 31 as shown in FIG. 4, smaller leakage (reverse) currents are obtained and an increase in the breakdown voltage results. This is particularly true in LSI-circuits (large scale integration).

Figure 2:
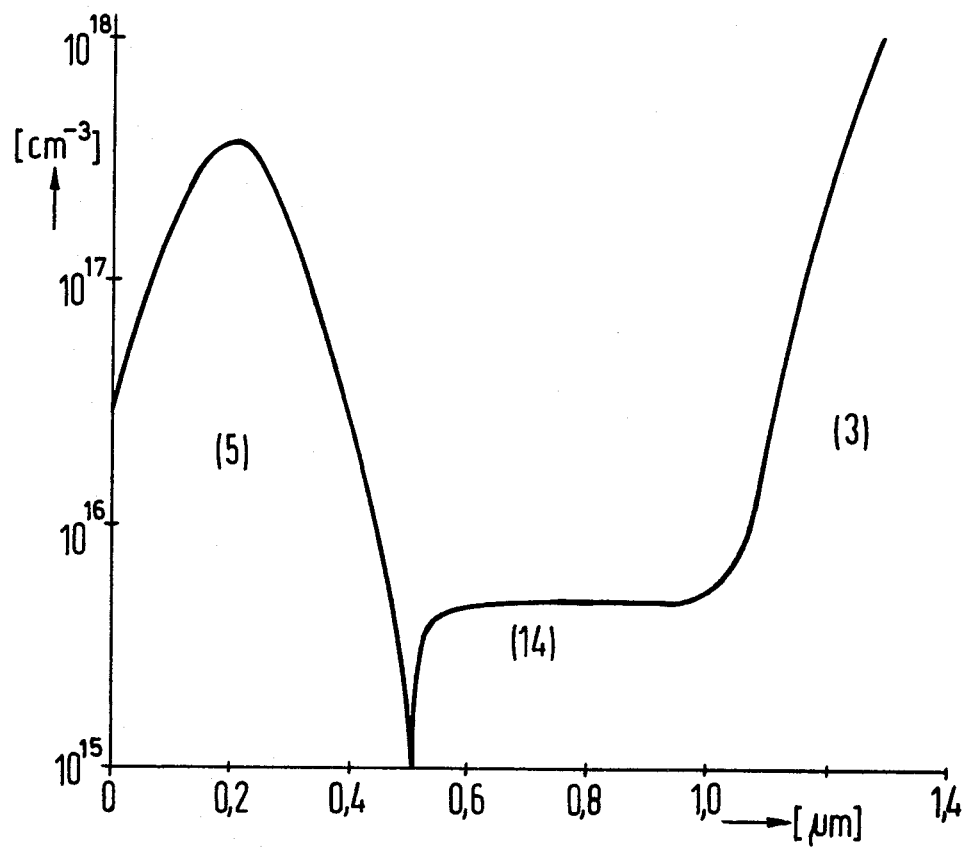
FIG. 2 illustrates the doping profile of an inversely operated planar transistor.

FIG. 2 shows a preferred doping profile which occurs with ion implantation when the base zone has a penetration depth of 0.5 μm, and when the implanted ions possess an energy of approximately 80 keV. The doping concentration in atoms per cm$^3$ is represented by the ordinate, and the penetration depth in microns is shown by the abscissa. As can be seen from FIG. 2, the doping concentration of the base zone, at its surface is approximately $5 \times 10^{16}$ cm$^{-3}$ and reaches a maximum value of approximately $5 \times 10^{17}$ cm$^{-3}$ at a distance of approximately 0.2 μm from the surface. The zone 14 has a doping concentration which is less than $10^{16}$ cm$^{-3}$. At a depth of 1.0 μm from the surface of the semiconductor layer 2, the doping concentration greatly increases as a result of the highly doped zone 3.

It will be apparent to those skilled in the art that many modifications and variations may be effected without departing from the spirit and scope of the novel concepts of the present invention.

We claim as our invention:

1. An inverse planar transistor adapted particularly for integrated circuits, comprising a semiconductor body having a first zone of a first conductivity type therein which extends to a planar surface of said semiconductor body and which provides a base zone for said transistor, a second zone in said body of the opposite conductivity type located on the opposite side of said base zone from that side which lies in said planar surface, said second zone being interfaced with said base zone and forming a PN junction, a relatively highly doped third zone of said second conductivity type in said body on the opposite side of said second zone from said base zone and interfaced with said second zone, a highly doped fourth zone of said second conductivity type extending from said planar surface to said third zone leading along side of and spaced from said base zone, said fourth zone providing a conductive path to said third zone, an insulating layer overlying the planar surface of said semiconductor body, and a Schottky contact forming a collector on the planar surface of said base zone, said Schottky contact having a guard ring underlying a marginal edge of said Schottky contact, said guard ring being formed as a relatively thick portion of said insulating layer surrounding the opening through which said Schottky contact extends into contact with said base zone as compared with the remaining portion of said insulating layer, the doping concentration of said base zone in the region of said Schottky contact being $\leq 10^{17}$/cm$^3$, the metal electrode of said Schottky contact being a metal from the group consisting of Pd, Pt and Al.

2. An inverse planar transistor according to claim 1, in which said base zone is produced by ion implantation.

3. An inverse planar transistor according to claim 1, in which said base zone has a penetration depth from said surface of approximately 0.5 μm.

* * * * *